US012736493B2

(12) United States Patent
Seo

(10) Patent No.: US 12,736,493 B2
(45) Date of Patent: Sep. 15, 2026

(54) SENSOR FOR DETECTING GAS AND GAS FLOW AND METHOD FOR MANUFACTURING SENSOR ELEMENT OF SENSOR

(71) Applicant: Hongik University Industry-Academia Cooperation Foundation, Seoul (KR)

(72) Inventor: Jung Hwan Seo, Seoul (KR)

(73) Assignee: Hongik University industry-Academia Cooperation Foundation, Seoul (KR)

(*) Notice: Subject to any disclaimer, the term of this patent is extended or adjusted under 35 U.S.C. 154(b) by 228 days.

(21) Appl. No.: 18/885,967

(22) Filed: Sep. 16, 2024

(65) Prior Publication Data

US 2025/0102457 A1 Mar. 27, 2025

(30) Foreign Application Priority Data

Sep. 21, 2023 (KR) ........................ 10-2023-0126531

(51) Int. Cl.
*G01N 27/12* (2006.01)
*G01F 1/28* (2006.01)
(Continued)

(52) U.S. Cl.
CPC ............. *G01N 27/128* (2013.01); *G01F 1/28* (2013.01); *H10P 72/0604* (2026.01)

(58) Field of Classification Search
CPC .. G01N 27/128; G01N 25/20; G01N 30/6095; G01N 27/221; G01N 27/414; G01N 27/4146; G01F 1/28; G01F 1/692; H10P 72/0604; H10P 72/0432; H10P 50/644; H10P 14/69215; H10W 20/42; H10H 20/815; B81C 1/00071; B81C 1/00111; B81C 1/00587; B81C 1/00619;
(Continued)

(56) References Cited

U.S. PATENT DOCUMENTS 5,715,052 A 2/1998 Fujino et al.
2014/0264642 A1* 9/2014 Mayer .................. G01N 27/128 438/49
(Continued)

FOREIGN PATENT DOCUMENTS

KR 10-2007-0115480 A 12/2007
KR 10-2011-0040012 A 4/2011
(Continued)

OTHER PUBLICATIONS

Office Action in Korean Appln. No. 10-2023-0126531, mailed on Aug. 10, 2025, 15 pages (with English translation).
(Continued)

*Primary Examiner* — Brandi N Hopkins
(74) *Attorney, Agent, or Firm* — Fish & Richardson P.C.

(57) ABSTRACT

A sensor element has a substrate, a channel formed in the substrate, and serving as an inlet passage of the gas, a plurality of micro-scale pillars formed in the channel and interfering with the flow of the gas moving through the channel, and a conductive layer formed on a surface of the plurality of pillars by deposition. A sensor has the sensor element, and a metering module electrically connected to the conductive layer, and configured to measure an electrical signal generated by the interference of the plurality of pillars with the flow of the gas.

12 Claims, 11 Drawing Sheets

(51) Int. Cl.
*G01F 1/684* (2006.01)
*G01P 5/24* (2006.01)
*H10P 72/00* (2026.01)

(58) Field of Classification Search
CPC ....... C30B 25/00; C23C 16/52; C23C 16/045; C23C 16/4407; B82Y 10/00; H10B 43/35; G01L 9/0073; H10K 71/00; B81B 7/02; H01L 21/6708; H01L 23/485; H01L 24/05; Y02E 10/50; H10D 62/118; B01L 3/5027
USPC ............................................ 73/198; 324/464
See application file for complete search history.

(56) References Cited

U.S. PATENT DOCUMENTS

2018/0011043 A1* 1/2018 Samarao .............. G01N 27/127
2018/0284060 A1* 10/2018 Sasago ............... G01N 27/4141

FOREIGN PATENT DOCUMENTS

KR 10-2016-0083335 A 9/2016
KR 10-2017-0040689 A 4/2017

OTHER PUBLICATIONS

Zöllner et al., "Gas-Flow Sensor Based on Self-Oscillating and Self-Sensing Cantilever," Proceedings, Dec. 2018, 2(13):846, 5 pages.

* cited by examiner

SENSOR FOR DETECTING GAS AND GAS FLOW AND METHOD FOR MANUFACTURING SENSOR ELEMENT OF SENSOR

CROSS-REFERENCE TO RELATED APPLICATION

This application claims priority to Korean Patent Application No. 10-2023-0126531, filed on Sep. 21, 2023, and all the benefits accruing therefrom under 35 U.S.C. § 119, the contents of which is incorporated by reference in its entirety.

TECHNICAL FIELD

The present disclosure relates to a sensor and a method for manufacturing a sensor element, and more particularly, to a sensor element for detecting gas and gas flow in an environment in which gas is produced, a method for manufacturing the same and a sensor having the sensor element.

This research is conducted by Hongik University, and funded by Convergence Research Group project of National Research Foundation of Korea, Ministry of Science and ICT, Republic of Korea (Development of micro-GC sensor system for detecting mixed gas in air pollution, No. 1711141350).

BACKGROUND

In a semiconductor fabrication process, surface treatment of a semiconductor component such as a wafer, for example, cleaning or etching occupies a very important part in improving the yield and precision of products. In general, the cleaning or etching process of the semiconductor component is performed using plasma or UV ozone.

To check the condition of the wafer to make sure that the process was properly completed, after the process is completed, elemental analysis of the surface is conducted using Time of Flight (ToF)-Secondary Ion Mass Spectroscopy (SIMS) that is a very expensive (a few hundred million to a few billion) wafer surface elemental analyzer.

TOF-SIMS is a technique that determines chemical composition and surface structure by analyzing positive or negative ions emitted during impingement of primary ions onto a surface and has a wide detection area and high precision. However, the device for using the corresponding method is expensive and is not small in size, which places limitations on detection on the spot. Additionally, to make use of TOF-SIMS, after the process of the semiconductor component is completed, it is necessary to inspect the semiconductor component, making it impossible to monitor in real time.

Accordingly, it is impossible to monitor the progress in real time during the process and control the process appropriately to the situation.

To monitor the status of the process in real time during the semiconductor process, a Residual Gas Analyzer (RGA) is used, for example. However, RGA is also expensive, cannot analyze a gas mixture, and is only limited to a high vacuum chamber. RGA is just partially used in a deposition process.

In the semiconductor fabrication process, the pressure condition in the process equipment is high pressure or low pressure rather than atmospheric pressure, causing a rarefied gas flow, not an ordinary fluid flow.

Monitoring process byproducts (fume) and gas flow in the semiconductor fabrication process is a key parameter for high yield in the semiconductor process, and is an essential task that needs to be performed with increasing design complexity in the semiconductor process.

For some technical or economic reasons, there is no device for detecting the controlled flow or leaks of gaseous materials by an in-situ method in real time to determine the flow in the chamber and the progress of the process during the process. This means that it is impossible to accurately monitor the progress during the process, transmit and receive feedback and control the process appropriately to the situation, resulting in lower precision and yield in the semiconductor component fabrication or manufacturing cost rise, so there is an urgent need for an approach to solve the problem.

SUMMARY

The present disclosure is directed to providing a sensor element based on high-aspect-ratio micropillar structure for measuring the flow rate and the progress of the process with high reliability and a sensor having the same.

According to an aspect of the present disclosure, a sensor element for detecting a gas and a flow of the gas includes a substrate, a channel formed in the substrate, and serving as an inlet passage of the gas, a plurality of micro-scale pillars formed in the channel and interfering with the flow of the gas moving through the channel, and a conductive layer formed on a surface of the plurality of pillars by deposition.

A sensor for detecting a gas and a flow of the gas according to an aspect of the present disclosure includes the sensor element, a metering module electrically connected to the conductive layer, and configured to measure an electrical signal generated by the interference of the plurality of pillars with the flow of the gas, and a processing module configured to process the electrical signal measured from the metering module.

According to an embodiment, the conductive layer is formed across the surface of the plurality of pillars, a bottom and a sidewall of the channel and an upper surface of the sidewall.

According to an embodiment, the sensor element includes a first pillar group including the plurality of pillars, and a second pillar group including the plurality of pillars, and wherein the first pillar group and the second pillar group are arranged at an interval in a length direction of the channel.

According to an embodiment, the metering module includes a frequency metering module to measure a frequency that changes by the action of a flow drag force of the gas on the plurality of pillars, and wherein the processing module calculates a flow velocity of the gas using a functional relationship between the frequency and the flow velocity.

According to an embodiment, the metering module includes a resistance metering module to measure a resistance value that changes when a gaseous material in the gas attach to the pillars, and wherein the processing module determines the presence of the gaseous material from the presence of a measurement value of the resistance metering module.

According to an embodiment, the sensor element includes a first pillar group and a second pillar group arranged at a predetermined interval in a length direction of the channel, and wherein the processing module determines a resistance value of each of the first pillar group and the second pillar group, and determines a temperature distribution in the channel using a functional relationship between resistance and temperature.

According to an embodiment, the sensor includes a micro heater disposed between the first pillar group and the second pillar group, and wherein the processing module determines a flow direction of the gas through a change in the temperature distribution in the channel by heat applied to the micro heater.

According to an embodiment, the sensor element includes a first pillar group and a second pillar group arranged at a predetermined interval in a length direction of the channel, and wherein the processing module determines a flow direction and a flow velocity of the gas using a difference of time at which the resistance value of each of the first pillar group and the second pillar group is measured.

According to another aspect of the present disclosure, there is provided a method for manufacturing a sensor element for detecting a gas and a flow of the gas includes the steps of: preparing a substrate, forming a masking layer on the substrate, removing the masking layer at an area at which a channel will be formed, and forming a groove in the substrate by etching to form the channel, wherein a material of the masking layer etched together during the etching is broken down into nano particles and the nano particles build up in the groove and act as a micro mask, a part of the substrate that is not etched by the micro mask form pillars in the channel, and a conductive material is deposited on the plurality of pillars to form a conductive layer.

According to an embodiment, the step of forming the masking layer comprises the steps of forming a hard masking layer on the substrate, and applying a photoresist onto the hard masking layer, and wherein the step of removing the masking layer comprises: removing the photoresist at an area at which the channel will be formed, and removing the exposed hard masking layer by removing the photoresist.

According to an embodiment, the sensor element includes a first pillar group and a second pillar group arranged at a predetermined interval in a length direction of the channel, and wherein the hard masking layer is formed at a location at which the first pillar group and the second pillar group will be formed.

According to an embodiment, the conductive layer is formed by glancing angle deposition performed while rotating the substrate placed at an angle.

DETAILED DESCRIPTION

Figure 1:
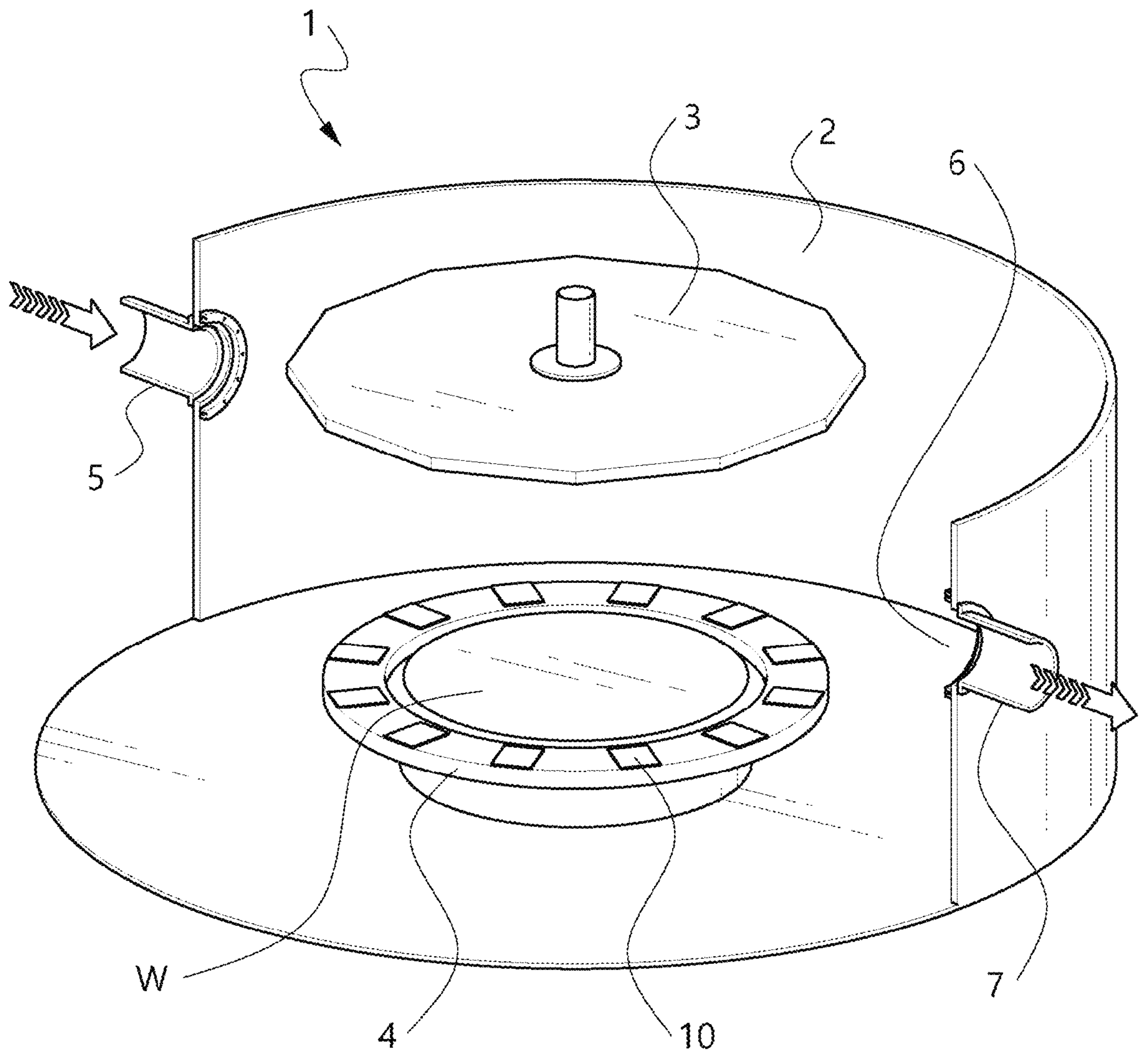
FIG. 1 is a schematic view of a treatment apparatus including a sensor according to an embodiment.

Hereinafter, exemplary embodiments of the present disclosure will be described with reference to the accompanying drawings. The present disclosure is described with reference to the embodiments shown in the drawings, but this is described as an embodiment, and the technical spirit of the present disclosure and the essential elements and their operation are not limited thereto.

<Treatment Apparatus 1>

FIG. 1 is a conceptual view of a treatment apparatus 1 including a sensor 10 according to an embodiment.

The treatment apparatus 1 according to this embodiment is a semiconductor treatment apparatus that performs a plasma cleaning treatment process to clean a semiconductor component such as a wafer W through a plasma generator (an electrode) 3 within a chamber 2 in a vacuum state.

In this embodiment, the plasma cleaning treatment apparatus is taken as an example of the treatment apparatus 1, but the treatment apparatus 1 is not limited thereto. The treatment apparatus 1 may be any other semiconductor treatment apparatus that produces gaseous byproducts including gaseous materials by treating the components in the chamber. Additionally, the treatment apparatus 1 does not need to be a semiconductor treatment apparatus, and may be an apparatus having any function and shape in which gas is generated by the process, and the flow of the corresponding gas is an important parameter of process management. Additionally, the sensor 10 is not a device that performs the process, and may be used in places that require gas detection and flowability determination, for example, factory pipes.

When the plasma cleaning treatment process starts, a cleaning gas is fed from an external cleaning gas tank (not shown) into the chamber 2 in a vacuum state through an inlet 5.

The cleaning gas ionized by the plasma generated by the electrode 3 reacts with a compound of the surface of the wafer W placed on a jig 4, to produce gas including gaseous materials, i.e., an organic compound including various substances.

The gas byproducts including gaseous materials leave an exhaust 7 in communication with the chamber 2 through an outlet 6. On the downstream of the exhaust 7, a pump (not shown) may be connected to form the vacuum in the chamber 2, and provide the pressure for gas venting.

The components of the semiconductor treatment device for performing the plasma cleaning treatment process are well known, and a further detailed description is omitted.

In the treatment process, usually, a reaction layer is formed near the wafer W, and the gas flow characteristics of the reaction layer in the processing chamber are an important factor in adjusting the uniformity of the process and the optimum gas flow rate.

According to this embodiment, the sensor 10 according to an embodiment is disposed in the outward radial direction of the wafer W on the jig 4. The sensor 10 detects gas and gas flow in the corresponding environment (for example, the reaction layer to the wafer).

As shown in FIG. 1, a plurality of sensors 10 may be arranged at an interval along the circumferential direction of the wafer W. The gas flow characteristics in the chamber (usually the reaction layer) may be comprehensively detected based on a measurement value of each sensor 10.

According to this embodiment, the sensor 10 is present inside the chamber 2 and disposed along the circumference of the wafer W on the jig 4, but is not limited thereto. The sensor 10 may be installed in the exhaust 7 to detect gas and gas flow flowing along the exhaust 7.

<Sensor 10>

Figure 2:
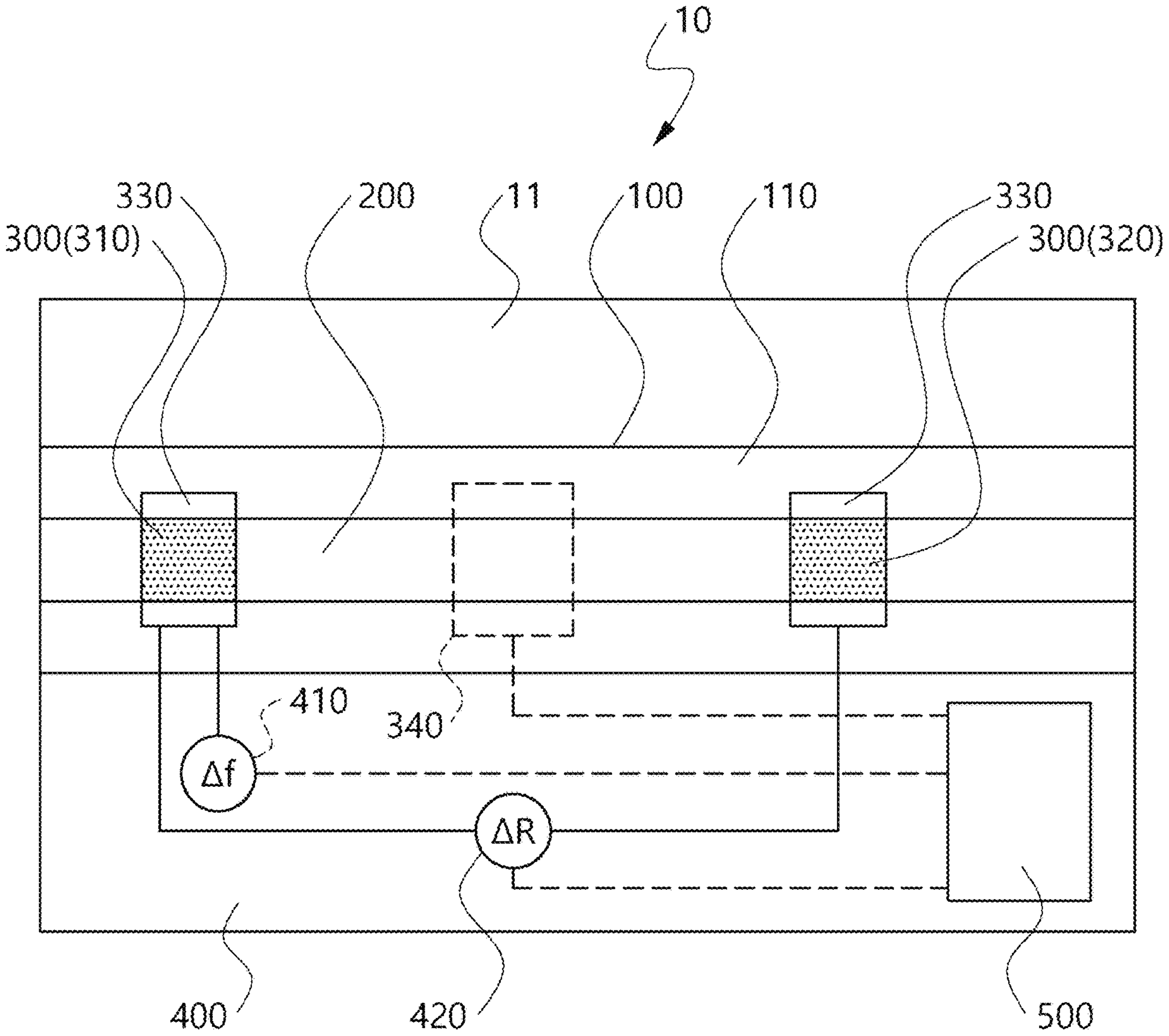
FIG. 2 is a schematic view of a sensor according to an embodiment.

FIG. 2 is a conceptual view of the sensor 10 according to an embodiment.

The sensor 10 includes the sensor element 100, a metering module 410, 420 and a processing module 500. Additionally, according to this embodiment, a micro heater 340 is formed in a body 11 of the sensor 10 to apply heat to at least part of the sensor element 100 (a channel 200).

The sensor element 100 includes a substrate 110 attached to the body of the sensor 10, the channel 200 formed in the substrate 110 and serving as an inlet passage of gas, a plurality of micrometer-scale pillars (hereinafter referred to as 'micro pillars') 300 formed in the channel 200, and a conductive layer (electrode) 330 formed on the plurality of micro pillars 300 by deposition.

From the perspective of measurement of a frequency change by action of a flow drag force of gas flowing in the channel 200 on the plurality of micro pillars 300 as described below, the micro pillars 300 may be uniformly formed all over the channel 200, or a group of micro pillars 300 may be formed in a part of the channel 200.

However, according to this embodiment, from the perspective of detection of the flow direction of gas, the sensor element 100 includes a first pillar group 310 including the plurality of micro pillars 300 and a second pillar group 320 including the plurality of micro pillars 300. As shown in FIG. 2, the first pillar group 310 and the second pillar group 320 are arranged spaced a predetermined distance apart from each other in the length direction of the channel 200. The micro heater 340 is disposed below the channel 200, and interposed between the first pillar group 310 and the second pillar group 320.

The metering module 410, 420 is electrically connected to the conductive layer 330. The metering module 410, 420 measures an electrical signal generated by interference of the plurality of micro pillars 300 with the flow of gas entering the channel 200.

The first metering module 410 is a frequency metering module to measure a change in frequency that changes by the action of the flow drag force of gas acts on the plurality of micro pillars 300. The first metering module 410 includes a transducer to convert chemical reaction or energy of the micro pillars 300 to an electrical signal. According to this embodiment, the first metering module 410 is electrically connected to the first pillar group 310 disposed near the wafer W.

The second metering module 420 is a resistance metering module to measure a resistance value that changes when the gaseous material in gas attaches to the plurality of micro pillars 300. The second metering module 420 includes a transducer to convert chemical reaction or energy of the micro pillars 300 to an electrical signal. The second metering module 420 is electrically connected to the first pillar group 310 and the second pillar group.

The processing module 500 processes the electrical signal measured from the metering module 410, 420. More specifically, the processing module 500 calculates the flow velocity of gas by calculating the inverse of the frequency measured by the first metering module 410 using a functional relationship between frequency and flow velocity stored in a memory. Additionally, the processing module 500 calculates the presence of gas, flow velocity and flow direction using the resistance value measured by the second metering module 420. It will be described in more detail below.

Additionally, the processing module 500 is connected to the micro heater 340 and controls on/off or temperature of the micro heater 340.

That is, the processing module 500 acts as an integrated processor to process an output signal from the component of the sensor 10, and control the operation of the component. The processing module 500 may have a communication function to transmit and receive a signal to/from an external computer.

Although the above description presents the processing module 500 as the integrated processor of the sensor 10, the processing module 500 is not limited thereto. The processing module 500 in the body of the sensor 10 may only act as a signal processing processor to remove noise from the electrical signal measured and converted by each metering module 410, 420, amplify the signal, and transmit the corresponding signal to the external computer via wired/wireless communication. The external computer may analyze the gas flow by processing the signal transmitted from the signal processor.

In this instance, a control processor for controlling the component such as the heater may be a separate module.

In this case, a functional block including the signal processing processor and the control processor in the body of the sensor 10 and the external computer may be said to be the processing module as used herein.

For convenience of description, FIG. 2 illustrates and describes the metering module 410, 420 and the processing module 500 separated from each other, but the metering module 410, 420 and the processing module 500 are not limited thereto. The metering module 410, 420 and the processing module 500 may be formed into a single chip, and the corresponding chip may be electrically connected to the conductive layer of the first pillar group 310 and the second pillar group 320 through solder wires. That is, the ⌈module⌋ as used herein is the concept including a physically distinguished component and a functionally distinguished component.

<Sensor Element 100>

Hereinafter, the sensor element (hereinafter, simply referred to as "element") 100 will be described.

Figure 3:
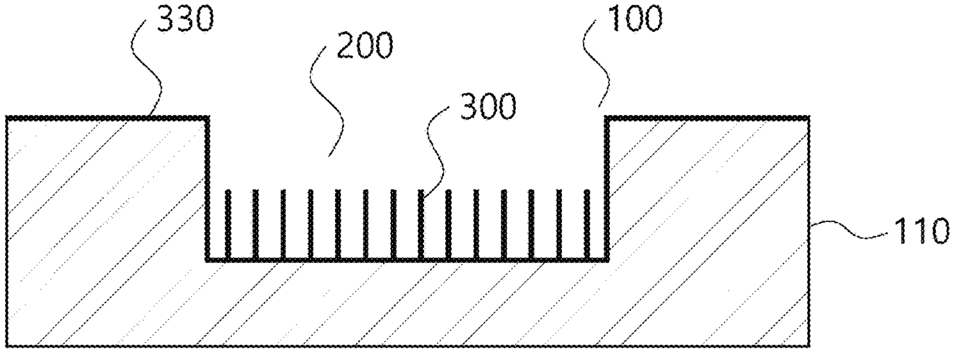
FIG. 3 is a schematic view of a sensor element.

FIG. 3 is a schematic view of the element 100 according to an embodiment. The element 100 according to this embodiment is configured to provide a gas channel in the sensor (a sensor system), and interfere with the gas flow to generate a measurable electrical signal.

The ⌈element⌋ may include a type of element that is separately formed and can be physically separated from the sensor and a type of element that is integrally formed with the body of the sensor and can be functionally separated.

First, a method for manufacturing the element 100 (hereinafter, referred to as "manufacturing method") will be described with reference to FIG. 4. FIGS. 4A to 4G are conceptual views for describing each step of the method for manufacturing the element 100 according to an embodiment.

Figure 4A:
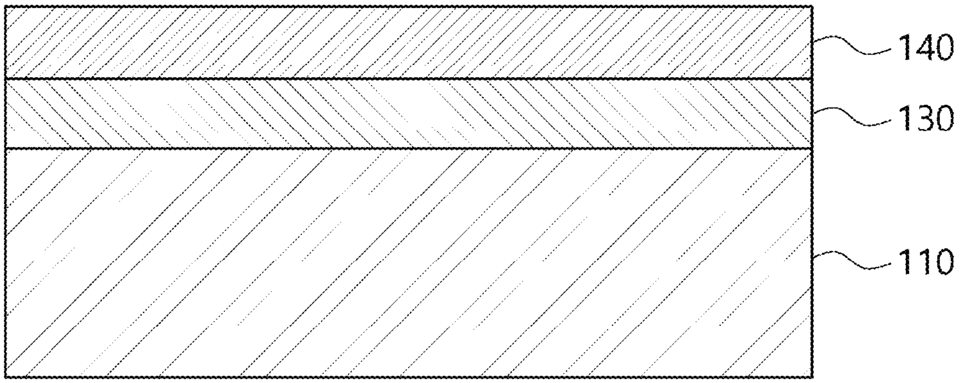
FIGS. 4A to 4G are conceptual views for describing each step of a method for manufacturing the sensor element shown in FIG. 3.

According to an embodiment, as shown in FIG. 4A, the manufacturing method includes the steps of preparing the substrate 110, for example, a silicon wafer, and forming a masking layer 130, 140 on the substrate 110.

According to this embodiment, the step of forming the masking layer includes forming the hard masking layer 130 on the substrate 110, and applying a photoresist (PR) onto the hard masking layer 130 to form the photoresist layer 140.

In this embodiment, the hard masking layer 130 is formed by depositing aluminum on the substrate 110.

The photoresist used to form the photoresist layer 140 may include any photoresist commonly used in the semiconductor process. In this embodiment, positive PR is used, and a developing solution dissolves away regions that were exposed to light through the exposure process.

Figure 4B:
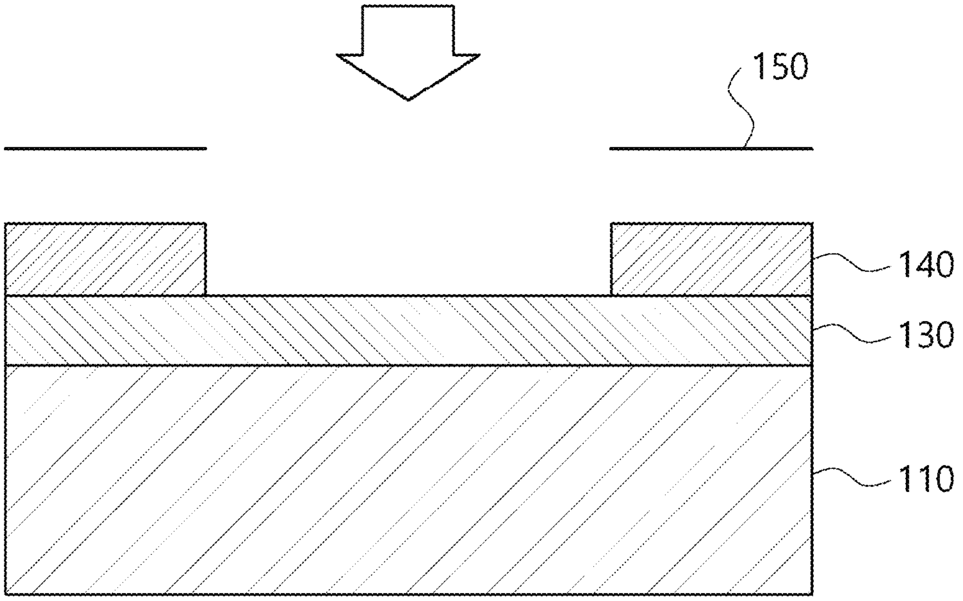
Figure 4C:
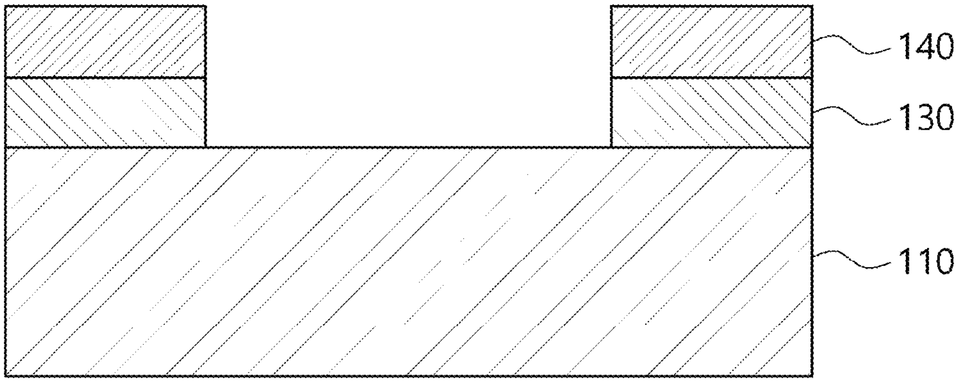

Subsequently, as shown in FIGS. 4B and 4C, the step of removing the masking layer 130, 140 is performed on an area of the substrate 110 at which the channel 200 will be formed.

First, as shown in FIG. 4B, a patterned mask 150 is placed at a corresponding location to a sidewall 112 of the channel 200, and the exposure process is performed to transfer the pattern. Subsequently, the developing solution dissolves away the photoresist that is exposed to light. Accordingly, the hard masking layer 130 in the area at which the channel 200 will be formed is exposed.

Subsequently, as shown in FIG. 4C, the hard masking layer 130 that is exposed by removing the photoresist is removed. In this embodiment, the hard masking layer 130 made of aluminum is removed using an aluminum etchant. A portion of the hard masking layer 130 covered by the photoresist layer 140 is left, and the exposed portion of the hard masking layer 130 is removed, i.e., where the channel 200 will be formed.

The process described in FIGS. 4A to 4C is well known in the semiconductor process, and subsidiary processes necessary for pre-treatment/post-treatment in each step are not described in further detail.

Figure 4D:
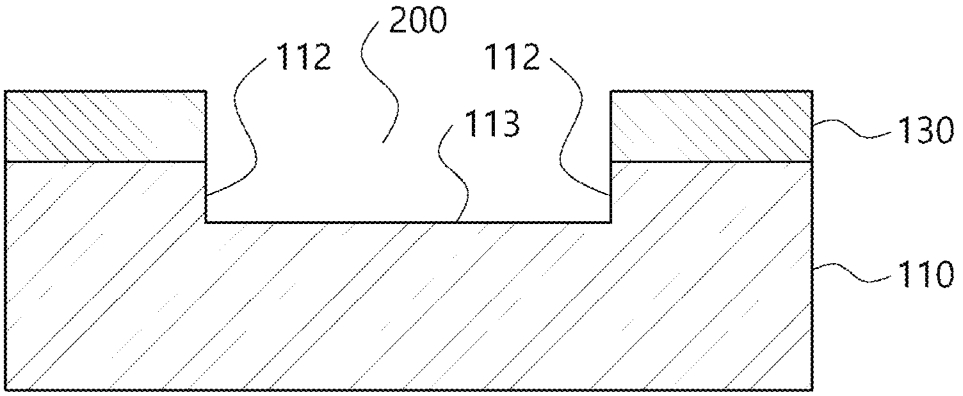
Figure 4E:
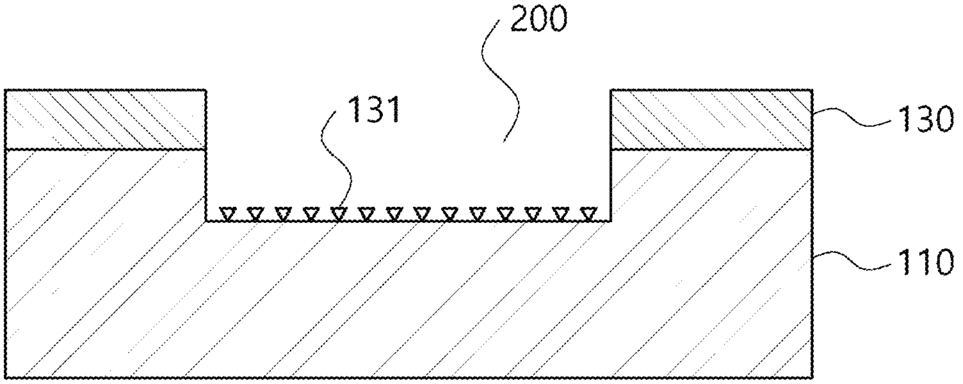
Figure 4F:
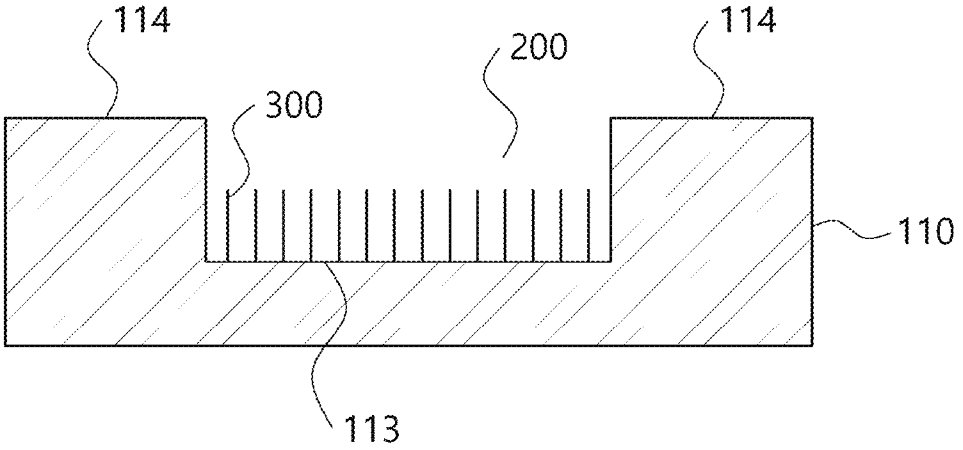
Figure 4G:
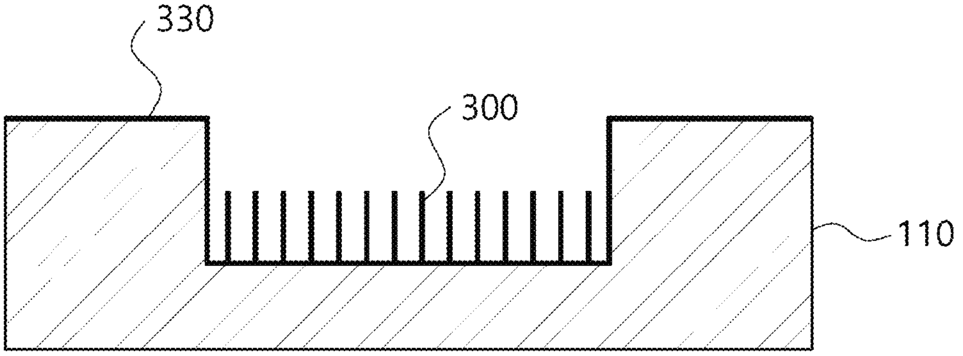

Subsequently, as shown in FIGS. 4D to 4F, the step of forming a groove in the substrate 110 by etching to form the channel 200 is performed.

According to this embodiment, the etching is performed using deep reactive ion etching (DRIE) process (hereinafter, simply referred to as "etching process").

As shown in FIG. 4D, when the etching process is performed, the groove is formed in the exposed upper surface of the substrate 110, starting to form the channel 200. Hereinafter, an area surrounding the region at which the micro pillars 300 will be formed in the channel 200 is defined as the sidewall 112 and a bottom 113.

A predetermined time after the channel 200 starts to be formed, the photoresist layer 140 is removed by the etching process and only the hard masking layer 130 remains on the substrate 110.

As shown in FIG. 4E, when the etching process continues, the groove in the substrate 110 is a little bit deeper than FIG. 4D. In this instance, the hard masking layer 130 is also etched away by the etching process.

When the masking layer is etched together in the etching process, the material of the masking layer breaks down into particles, and the particles 131 float and build up on the bottom 113 of the groove that forms the channel 200.

In this embodiment, in the same way as the typical semiconductor process, exhaust for removing impurities is performed. However, as described below, because the channel 200 according to this embodiment has a very small width, as opposed to the typical semiconductor process, it is understood that the particles 131 build up in the channel 200 due to unsmooth exhaust in the channel 200.

As described above, the particles 131 buildup in the groove of the channel 200 act as a micro mask in the etching process.

Accordingly, as shown in FIG. 4F, the portion on which the particles 131 build up is not etched, and the remaining portion is etched at the intended rate. In other words, there is a difference in the degree of etching in the channel 200, and as a result, as shown in FIG. 4F, a part of the substrate 110 remains in the channel 200 (i.e., inadequate etching) to form the large number of micro pillars 300 extending from the bottom.

As in the embodiment of FIG. 2, when the sensor element includes the first pillar group 310 and the second pillar group 320, the hard masking layer 130 may be only formed at the location at which the first pillar group 310 and the second pillar group 320 will be formed, and the above-described process may be performed. Alternatively, the micro pillars 300 may be formed all over the channel 200, and the micro pillars 300 at the region other than the first pillar group 310 and the second pillar group 320 may be removed through the predetermined etching process.

Figure 5:
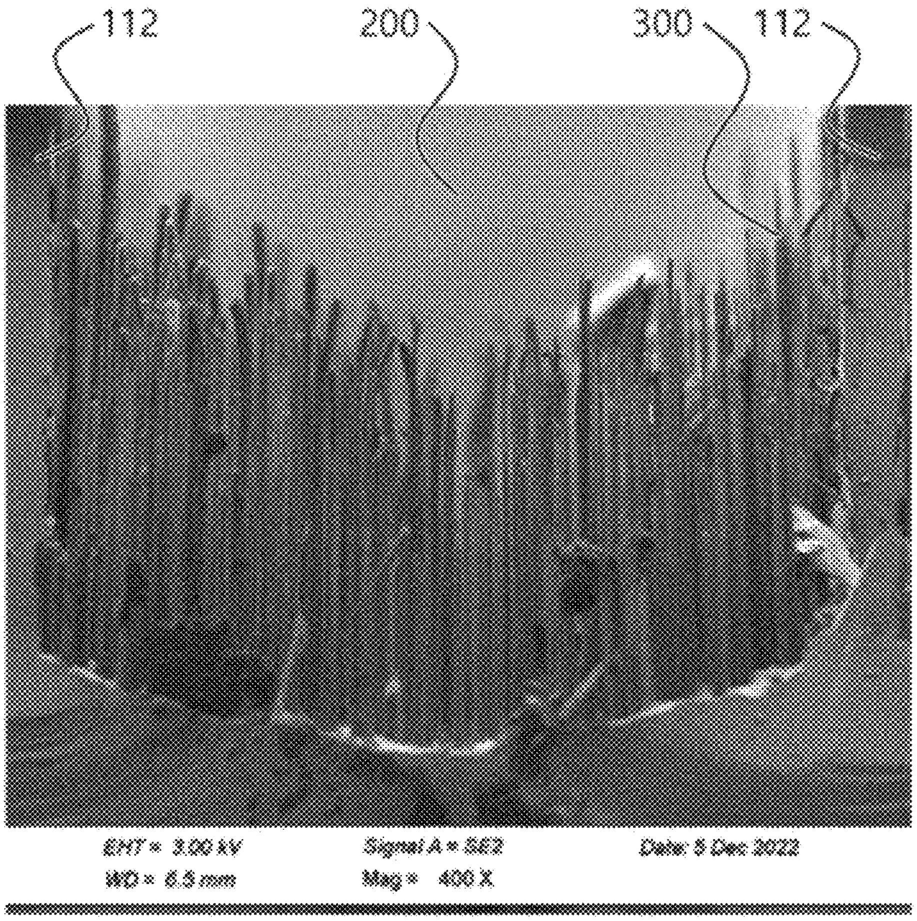
FIG. 5 is an enlarged scanning electronic microscopic (SEM) image of a channel of a sensor element according to an embodiment.

FIG. 5 is an enlarged scanning electron microscopic image of the channel 200 of the element 100.

As shown in FIG. 5, the large number of micro pillars 300 are formed between the sidewalls 112 of the channel 200.

Because the micro pillars 300 is formed by the action of the particles 131 buildup in the channel 200 as the micro mask in the etching process, the length of the micro pillars 300 is not perfectly uniform and some micro pillars 300 irregularly stand.

Additionally, because the groove of the channel 200 is etched to a predetermined depth before the etching of the hard masking layer 130 (see FIG. 4E), the micro pillars 300 are shorter in length than the sidewall 112. In other words, when the etching timing is adjusted by adjusting the thickness of the hard masking layer 130 and the photoresist layer 140, the total length of the nanorods 111 may be adjusted when forming the nanorods 111.

Furthermore, when the exhaust of the particles 131 is further hindered by reducing the width of the channel 200, the length of the micro pillars 300 may be increased, and the number of micro pillars 300 may be adjusted.

Meanwhile, the inventors confirmed that when the width of the channel 200 (i.e., the distance between the sidewalls 112) is overly large, the micro pillars 300 may not be formed. It is thought that when the width of the channel 200 is large, the exhaust becomes smooth and the action of the particles 131 as the micro mask does not occur.

According to this embodiment, the distance between the two sidewalls 112 of the channel 200 is set to a height to which the particles 131 are not completely released and fall down to the groove and at least some of them remain, so as to form the micro pillars 300 above a predetermined height.

Additionally, due to the feature of the DRIE process, as the depth increases, more etching occurs at the side, so it was confirmed that the bottom portion of the sidewall 112 is etched to a larger extent than the top portion, resulting in a smaller thickness. In other words, it means that when the thickness of the sidewall 112 is overly small, the bottom portion of the sidewall 112 may break and the sidewall 112 may collapse in the etching process.

Accordingly, in this embodiment, in the channel 200 where the sidewall 112 should be maintained, the thickness of the sidewall 112 of the channel 200 is set to such a dimension that the sidewall 112 of the channel 200 is maintained without collapse in the etching process.

When the channel 200 having the very large number of micro pillars 300 therein is used as a flow channel of gas in the sensor element 100, the area inside the channel 200 interfering with the flow of gaseous material in gas may be maximized.

Referring back to FIG. 4G, after the step of FIG. 4F, the conductive layer 330 is formed by depositing a conductive material on the micro pillars 300.

Specifically, when the conductive material is deposited on the bottom 113 and the sidewall 112 of the channel 200, all or part of the upper surface 114 of the sidewall 112, and the surface of the micro pillars 300, the conductive layer 330 is formed across the bottom 113 and the sidewall 112 of the channel 200, all or part of the upper surface 114 of the sidewall 112 and the surface of the micro pillars 300.

Figure 6:
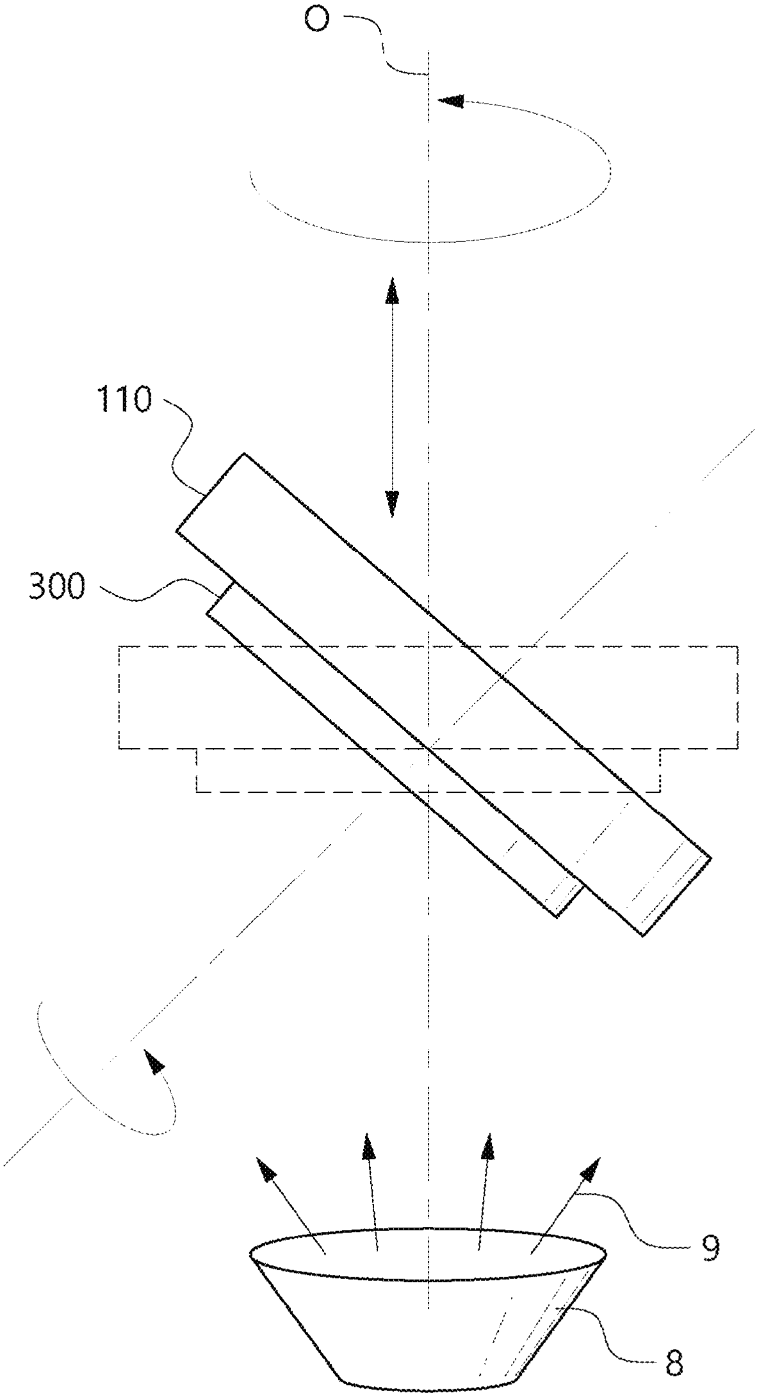
FIG. 6 is a conceptual view illustrating a deposition process of forming a conductive layer.

FIG. 6 is a conceptual view showing the process of forming the conductive layer 330.

According to this embodiment, to properly deposit the conductive material on the surface of the micro pillars 300 having high-aspect-ratio structure characteristics, the deposition process is performed by glancing angle deposition.

As shown in FIG. 6, the substrate 110 is installed at an angle with respect to a center axis O of a source 8 that forms a flux 9 of the conductive material, and deposition is performed while reciprocating the substrate 110 in the axial O direction, and at the same time, rotating the substrate 110 around the center axis of the substrate 110.

Figure 7:
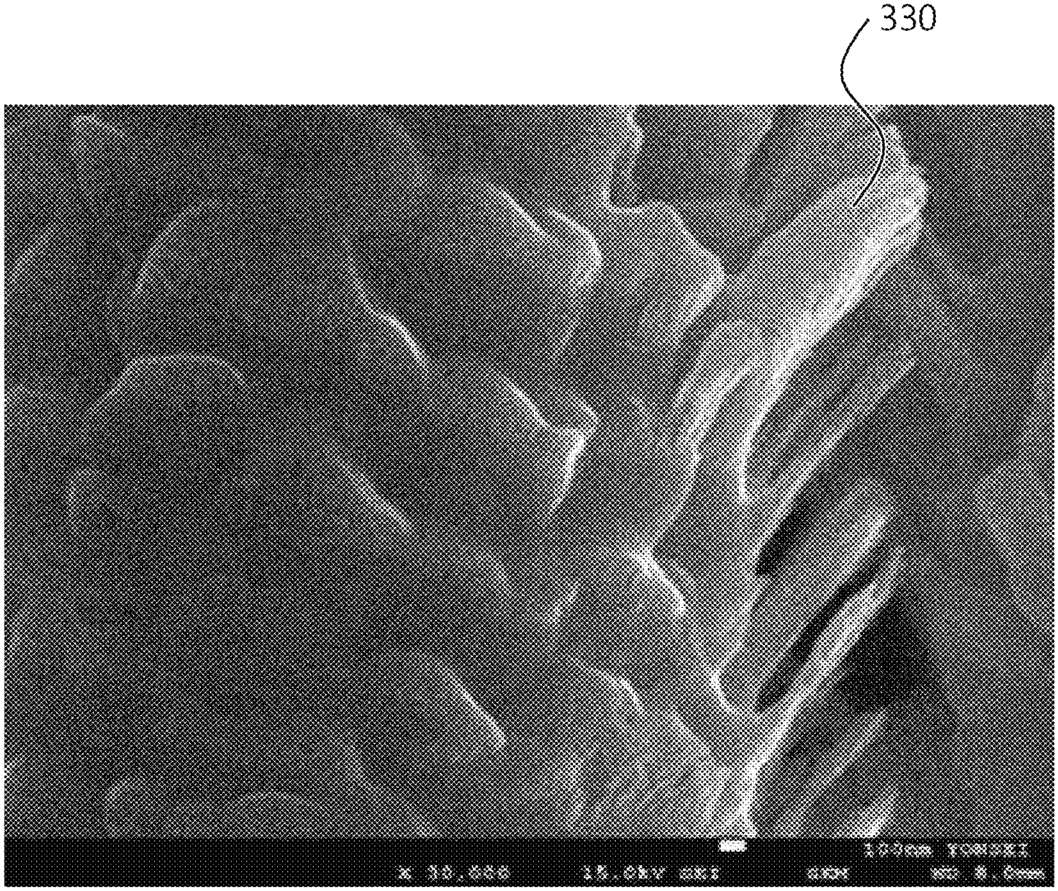
FIG. 7 is an enlarged SEM image of a conductive layer deposited on a pillar.

Accordingly, the conductive material is uniformly deposited on the bottom 113, the sidewall 112 of the channel 200, all or part of the upper surface 114 of the sidewall 112 and the surface of the micro pillars 300. FIG. 7 is an enlarged scanning electronic microscopic image of the micro pillars having the conductive layer 330.

The conductive layer 330 formed across the bottom 113 and the sidewall 112 of the channel 200, all or part of the upper surface 114 of the sidewall 112 and the surface of the micro pillars 300 becomes an electrode. That is, the conductive layer 330 acts as an electrode for electrical connection of the metering module 410, 420 for detecting the electrical signal that changes by the interference of the micro pillars 300 with the flow of gas entering the channel 200.

<Gas and Gas Flow Measurement>

Hereinafter, the gas and gas flow measurement using the sensor 10 will be described.

(Frequency Measurement)

Figure 8:
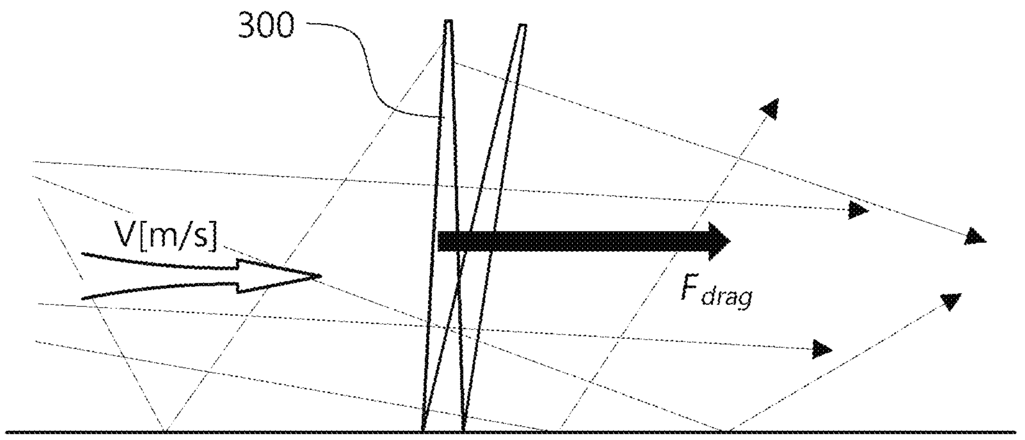
FIG. 8 is a diagram illustrating the principle in which frequency changes by gas-induced bending of a pillar.
Figure 9:
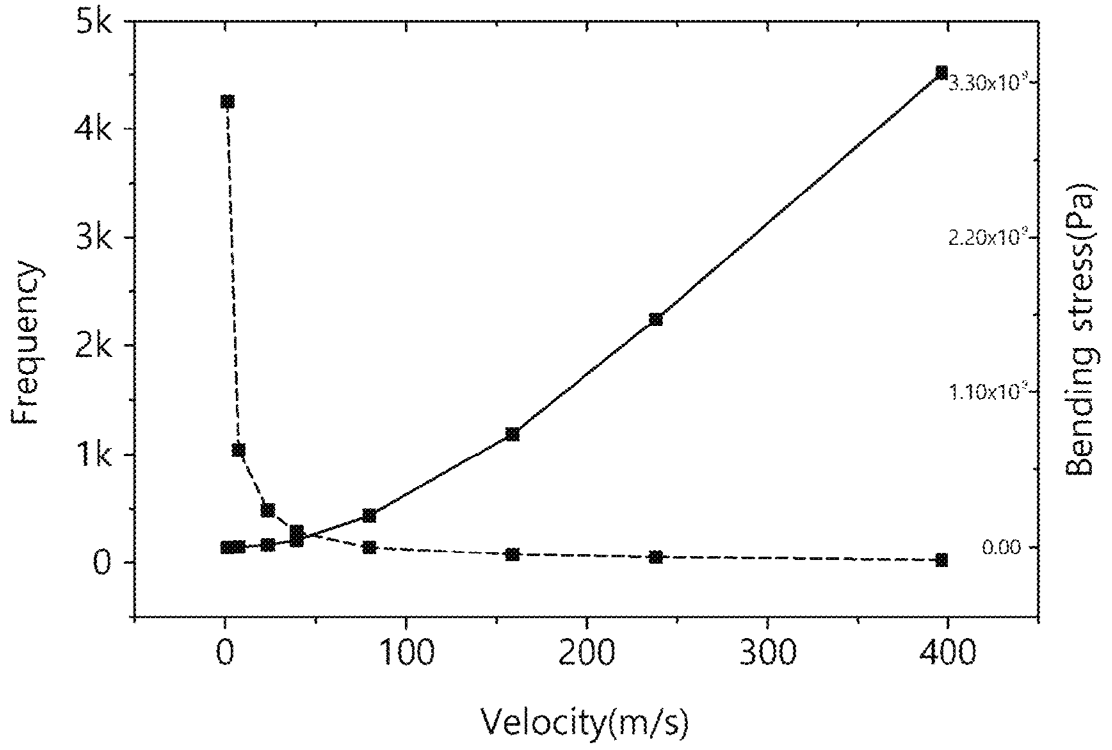
FIG. 9 is a graph showing a correlation between frequency and flow velocity.

FIGS. 8 and 9 are a diagram and a graph for describing the concept of frequency measurement by gas flow-induced bending of the micro pillars 300, respectively.

As shown in FIG. 8, when a gas flow is generated in a direction within the channel 200, the micro pillars 300 bend toward the flow direction by the flow drag force $F_{drag}$ by the gas flow. According to this embodiment, it was found that the micro pillars 300 can withstand without breaking from a very low velocity range up to approximately 400 m/s due to the high aspect ratio.

When the micro pillars 300 bend, the resonance frequency of the micro pillars 300 changes, and a relationship between the force (drag) applied to the micro pillars 300 and the frequency is written as [Equation 1] below.

$$f_{beam} = \frac{1}{2\pi}\left(\frac{3EI}{FL^3}\right)^2 \quad \text{[Equation 1]}$$

Here, $f_{beam}$ is the frequency, L is the length of the micropillar, E is the elasticity coefficient of the micropillar, I is the second moment of area of the micropillar, and F is the drag acting on the micropillar.

Additionally, as shown in FIG. 9, the drag force and the flow velocity show a constant (quadratic) functional relationship, and the functional relationship is written as [Equation 2] below.

$$F_{drag} = \frac{1}{2}\rho V^2 A C_D \quad \text{[Equation 2]}$$

Here, $F_{drag}$ is the drag force by the gas flow, V is the (relative) flow velocity, A is the reference area, and $C_D$ is the drag coefficient.

That is, when the frequency is measured, the drag force acting on the micro pillars 300 may be calculated, and when the drag force is calculated, the flow velocity V may be calculated.

According to this embodiment, the first metering module 410 measures the frequency that changes when the micro pillars in the corresponding group bend by the action of the flow drag force $F_{drag}$ of gas on the micro pillars (in this embodiment, the first pillar group 310). The frequency of the second pillar group 320 may be measured together, but the frequency characteristics of the first pillar group 310 that comes into contact with the gas flow earlier may reflect the gas flow velocity better.

The frequency measurement may be done by measuring the current or resistance of the first pillar group 310, and converting the corresponding value by a known method, for example, Fourier transform.

When the frequency change is first measured, the processing module 500 may detect that the gas flow is generated in the channel 200. That is, the sensor 10 may first detect the presence of gas byproducts in the channel 200 through the measurement value of the first metering module 410.

Further, the processing module 500 calculates the flow velocity of gas using the functional relationship ([Equation 1] and [Equation 2]) between the frequency and the flow velocity stored in an embedded memory or an external memory. That is, in addition to the presence of gas in the channel 200, the sensor 10 may calculate the flow velocity of the corresponding gas.

The flow velocity of gas is a function of flow rate, and the processing module 500 may calculate the flow rate of gas through the measured flow velocity of gas. The flow rate of gas is an important parameter in monitoring the semiconductor process.

(Resistance Measurement)

Figure 10:
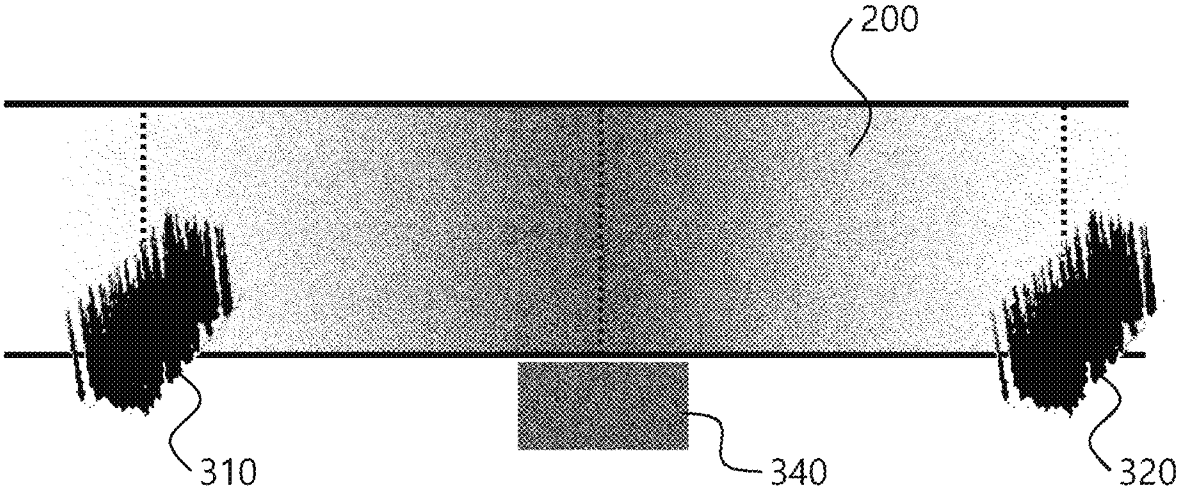
FIG. 10 is a diagram illustrating the principle in which resistance changes when a gaseous material in gas attaches to a pillar.

FIG. 10 is a diagram illustrating the principle of a change in electrical resistance of the first pillar group 310 and the second pillar group 320.

When the gaseous material in the gas entering the channel 200 contacts or attaches to the conductive layer of the first pillar group 310 and the second pillar group 320, the electrical resistance of the first pillar group 310 and the second pillar group 320 changes.

According to this embodiment, the interference with the gas entering the channel 200 is maximized by the micro pillars 300 having a high aspect ratio in the channel 200. As shown in FIG. 10, the gaseous material (g) in the gas flowing in the channel 200 attaches to the surface (surface of the conductive layer) of the micro pillars in the first pillar group 310 and the second pillar group 320, and accordingly, the electrical resistance of the first pillar group 310 and the second pillar group 320 changes.

The second metering module 420 measures the electrical resistance of the first pillar group 310 and the second pillar group 320. Through the resistance value measured by the second metering module 420, the processing module 500 may calculate the flow direction and flow velocity of gas using a time difference of the resistance value change measured in the first pillar group 310 and the second pillar group 320.

Figure 11:
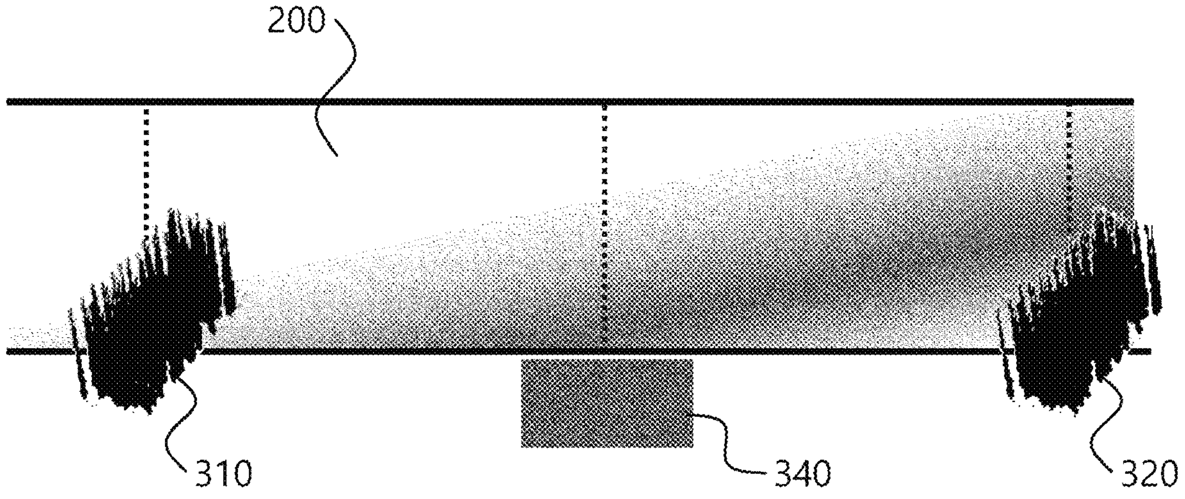
FIG. 11 is a graph showing a time difference of resistance values measured according to flow direction of gas in a channel of a sensor element.

FIG. 11 is a graph showing a change in resistance value when gas flows from the first pillar group 310 to the second pillar group 320 in the channel 200.

When the time at which the resistance change is found in the first pillar group 310 and the second pillar group 320 is measured, the flow direction of gas may be known (flow towards where the signal appears later). Additionally, the processing module 500 may calculate the flow velocity V of the corresponding gas using the known distance L between the first pillar group 310 and the second pillar group 320 and the time difference Δt of the time at which the resistance change is found in the first pillar group 310 and the second pillar group 320 according to the relationship of the following [Equation 3].

$$V = \frac{L}{\Delta t} \quad \text{[Equation 3]}$$

The flow velocity of gas is a function of flow rate, and the processing module 500 may calculate the flow rate of gas through the measured flow velocity of gas. The flow rate of gas is an important parameter in monitoring the semiconductor process.

Meanwhile, the processing module 500 may detect the presence of gaseous materials (gas) in the channel 200 through the resistance value measured by the second metering module 420, and determine the flow direction of gas by determining the temperature distribution in the channel 200.

Figure 12:
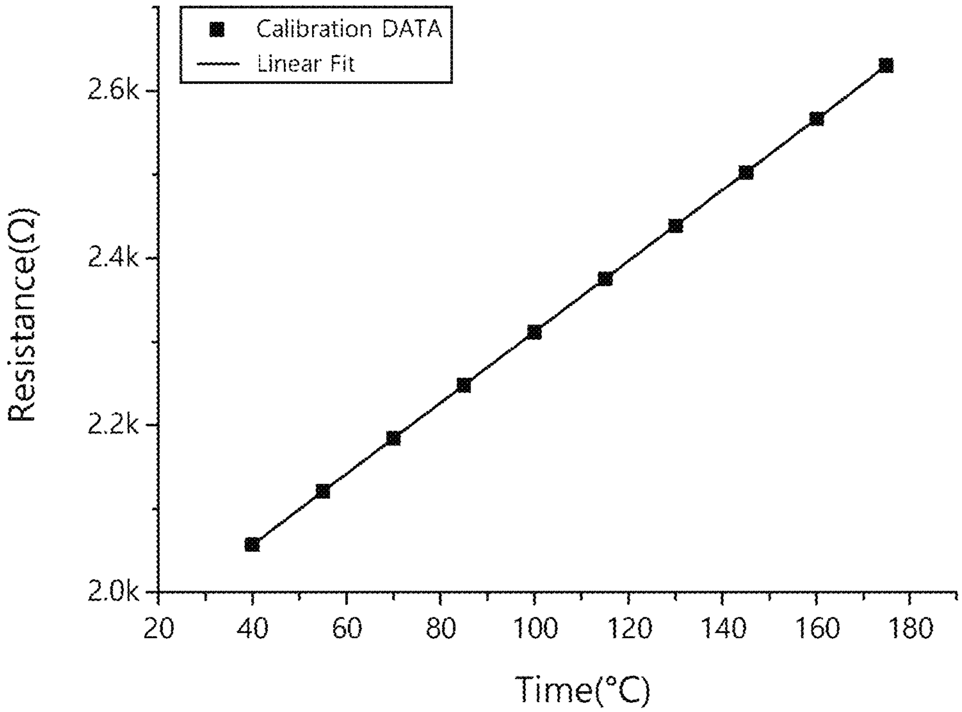
FIGS. 12 and 13 are diagrams illustrating a temperature distribution in a channel of a sensor element by the gas flow.
Figure 13:
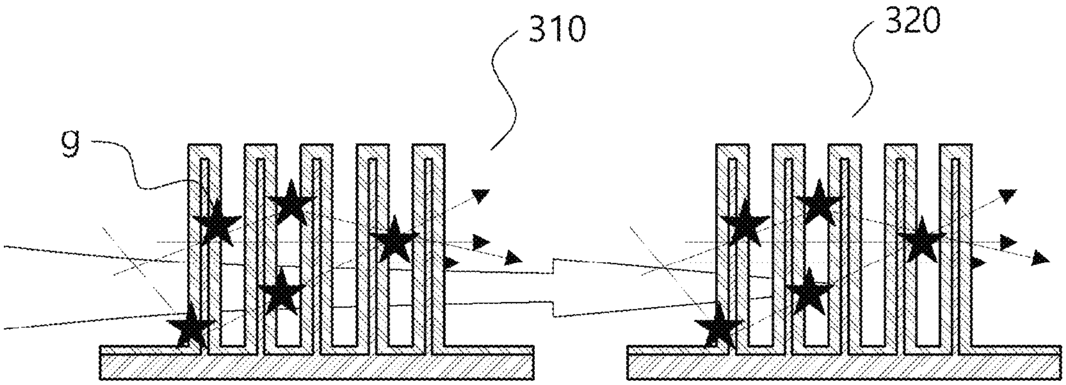
Figure 14:
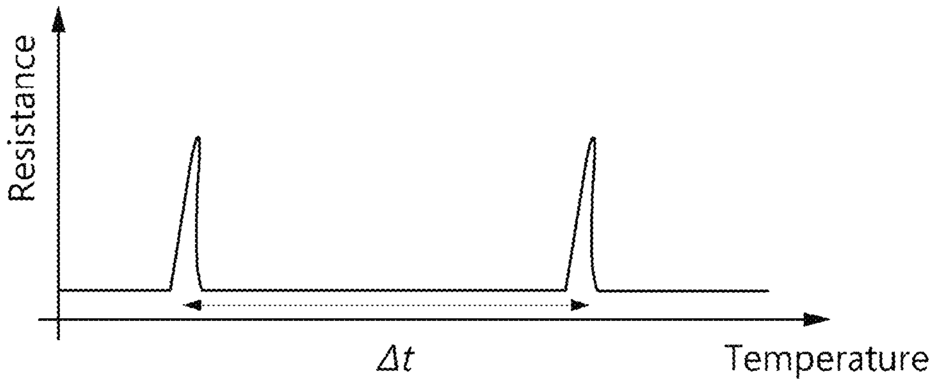
FIG. 14 is a graph showing a correlation between resistance value and temperature.

FIGS. 12 to 14 are a diagram and a graph for describing the concept of measurement of temperature in the channel 200 and measurement of gas flow characteristics using the same, respectively.

As shown in FIG. 14, it is known that electrical resistance and temperature have an approximately proportional functional relationship. That is, it means that when the electrical resistance of each of the first pillar group 310 and the second pillar group 320 increases, the temperature near the first pillar group 310 and the second pillar group 320 increases. In other words, it may be represented that when the temperature near the first pillar group 310 and the second pillar group 320 increases, the electrical resistance of each of the first pillar group 310 and the second pillar group 320 increases.

A difference in electrical resistance measured in each of the first pillar group 310 and the second pillar group 320 formed by substantially the same process may be interpreted as a difference in temperature near each of the first pillar group 310 and the second pillar group 320.

When the semiconductor treatment process starts, the processing module 500 operates the micro heater 340 to perform control to apply heat to the center of the channel 200. Additionally, the second metering module 420 measures the electrical resistance of the first pillar group 310 and the second pillar group 320.

As shown in FIG. 12, when there is no gas flow in the channel 200, the temperature in the channel 200 uniformly flows from the micro heater 340, so the temperature in the first pillar group 310 and the second pillar group 320 shows a substantially similar pattern.

When gas flows into the channel 200, the temperature distribution in the channel 200 changes by the gas flow. Accordingly, with the temperature change near the first pillar group 310 and the second pillar group 320, the electrical resistance measured in the first pillar group 310 and the second pillar group 320 changes.

When gas moves down from the top of the channel 200, the electrical resistance of each of the first pillar group 310 and the second pillar group 320 will change similarly to each other. In this case, the processing module 500 may determine that the temperature distribution in the channel 200 is uniform and the gas flow is not generated in a direction.

In contrast, when gas flows in a direction of the channel 200 (for example, from the first pillar group 310 to the second pillar group 320), as shown in FIG. 13, it has the temperature distribution characteristics in which hot air near the micro heater 340 flows to the second pillar group 320 by the gas flow. In this case, the electrical resistance of the second pillar group 320 increases so much compared to the first pillar group 310.

Accordingly, the processing module 500 may detect the flow direction of gas based on the corresponding measurement value.

As described above, through the resistance value measured by the second metering module 420, the processing module 500 may detect the presence of gaseous materials (gas) in the channel 200, and determine the flow direction of gas by determining the temperature distribution in the channel 200.

Meanwhile, the processing module 500 may calculate the flow direction and the flow velocity of gas using the time difference of the resistance value change measured in the first pillar group 310 and the second pillar group 320.

SUMMARY

The sensor element 100 according to this embodiment includes the plurality of micro pillars having a high aspect ratio in the channel 200.

The micro pillars easily interfere with gas flowing in the channel 200, and accordingly flexibly bend by the flow drag force of gas. The sensor 10 may detect the presence of gas and measure the flow velocity of gas by measuring the frequency change with the shape change of the pillars. The flow rate of gas may be also determined through the flow velocity of gas.

Additionally, because the micro pillars have a very wide ratio of surface, they allow gaseous materials in gas to easily attach. Accordingly, the sensor 10 may detect the presence of gas by measuring the change in resistance when gaseous materials attach.

That is, the presence of gas may be detected in a twofold way through the change in frequency and the change in resistance value of the micro pillars.

Additionally, the sensor element 100 according to this embodiment includes two pillar groups arranged spaced apart from each other. The flow direction of the gas and the flow velocity of the gas may be measured using the time difference of the electrical signal measured in the two pillar groups.

That is, the flow velocity of gas may be determined in a twofold way through the frequency change and resistance value change of the micro pillars.

Furthermore, the sensor 10 according to this embodiment includes the micro heater 340 to apply heat to the channel 200 of the sensor element 100.

The temperature distribution in the channel 200 may be determined through resistance value change, and accordingly the flow direction of gas may be determined.

That is, the flow direction of gas may be determined in a twofold way through the frequency change and resistance value change of the micro pillars.

As described above, according to the sensor element 100 and the sensor 10 according to this embodiment, it may be possible to detect the presence gas byproducts produced in the semiconductor treatment process and determine the flow characteristics such as flow direction and flow velocity in a twofold or threefold way, and furthermore, calculate an accurate flow velocity value.

Accordingly, it may be possible to accurately monitor process byproducts (fume) produced in the semiconductor fabrication process and the gas flow.

The sensor element according to this embodiment may allow mass production at low cost through the MEMS process, thereby providing the low cost/high efficiency sensor. Additionally, as described above, it may be possible to measure the flow rate and the progress of the process with high reliability through triple cross check based on the high-aspect-ratio micro pillar structure.

It may be possible to determine the flow rate through frequency change measurement due to the drag force generated by the flow velocity in the frequency range and determine the flow velocity and process reactant materials by measuring the temperature change with the compound composition change through the micro heater. The structure having wider specific surface area than the existing 2D sensor through conductive layer deposition may determine the flow velocity and process reactant materials through high reliability electrical signal change detection.

Accordingly, when connected to the equipment exhaust in which gas materials are generated during the process, it may be possible to monitor the progress of the process through real-time analysis of gas substances and flow rate during the process and quickly detect errors in process conditions, thereby detecting and dealing with sudden accidents or process failure. Through this, it is expected to improve the semiconductor component precision and yield, and task safety in the semiconductor process.

What is claimed is:

1. A sensor for detecting a gas and a flow of the gas, comprising:
- a sensor element comprising:
  - a substrate,
  - a channel formed in the substrate, and serving as an inlet passage of the gas,
  - a plurality of micro-scale pillars formed in the channel and interfering with the flow of the gas moving through the channel, and
  - a conductive layer formed on a surface of the plurality of pillars by deposition;
- a metering module electrically connected to the conductive layer, and configured to measure an electrical signal generated by the interference of the plurality of pillars with the flow of the gas; and
- a processing module configured to process the electrical signal measured from the metering module.

2. The sensor according to claim 1, wherein the conductive layer is formed across the surface of the plurality of pillars, a bottom and a sidewall of the channel and an upper surface of the sidewall.

3. The sensor according to claim 1, wherein the sensor element includes a first pillar group including the plurality of pillars, and a second pillar group including the plurality of pillars, and
- wherein the first pillar group and the second pillar group are arranged at an interval in a length direction of the channel.

4. The sensor according to claim 1, wherein the metering module includes a frequency metering module to measure a frequency that changes by the action of a flow drag force of the gas on the plurality of pillars, and
- wherein the processing module calculates a flow velocity of the gas using a functional relationship between the frequency and the flow velocity.

5. The sensor according to claim 1, wherein the metering module includes a resistance metering module to measure a resistance value that changes when a gaseous material in the gas attach to the pillars, and
- wherein the processing module determines the presence of the gaseous material from the presence of a measurement value of the resistance metering module.

6. The sensor according to claim 5, wherein the sensor element includes a first pillar group and a second pillar group arranged at a predetermined interval in a length direction of the channel, and
- wherein the processing module determines a resistance value of each of the first pillar group and the second pillar group, and determines a temperature distribution in the channel using a functional relationship between resistance and temperature.

7. The sensor according to claim 6, wherein the sensor includes a micro heater disposed between the first pillar group and the second pillar group, and
- wherein the processing module determines a flow direction of the gas through a change in the temperature distribution in the channel by heat applied to the micro heater.

8. The sensor according to claim 5, wherein the sensor element includes a first pillar group and a second pillar group arranged at a predetermined interval in a length direction of the channel, and
- wherein the processing module determines a flow direction and a flow velocity of the gas using a difference of time at which the resistance value of each of the first pillar group and the second pillar group is measured.

9. A method for manufacturing a sensor element of a sensor for detecting a gas and a flow of the gas, the method comprising the steps of:
- preparing a substrate;
- forming a masking layer on the substrate;
- removing the masking layer at an area at which a channel will be formed; and
- forming a groove in the substrate by etching to form the channel,
- wherein a material of the masking layer etched together during the etching is broken down into nano particles and the nano particles build up in the groove and act as a micro mask,
- wherein a part of the substrate that is not etched by the micro mask form pillars in the channel, and
- wherein a conductive material is deposited on the plurality of pillars to form a conductive layer.

10. The method for manufacturing the sensor element according to claim 9, wherein the step of forming the masking layer comprises the steps of:
- forming a hard masking layer on the substrate, and
- applying a photoresist onto the hard masking layer, and wherein the step of removing the masking layer comprises:

removing the photoresist at an area at which the channel will be formed, and removing the exposed hard masking layer by removing the photoresist.

11. The method for manufacturing the sensor element according to claim 10, wherein the sensor element includes a first pillar group and a second pillar group arranged at a predetermined interval in a length direction of the channel, and wherein the hard masking layer is formed at a location at which the first pillar group and the second pillar group will be formed.

12. The method for manufacturing the sensor element according to claim 9, wherein the conductive layer is formed by glancing angle deposition performed while rotating the substrate placed at an angle.

* * * * *